(12) United States Patent
Watanabe et al.

(10) Patent No.: US 9,735,767 B2
(45) Date of Patent: Aug. 15, 2017

(54) ELECTRONIC CONTROL APPARATUS HAVING SWITCHING ELEMENT AND DRIVE CIRCUIT

(75) Inventors: Kazunori Watanabe, Kariya (JP); Shunichi Mizobe, Kariya (JP); Tsuneo Maebara, Nagoya (JP)

(73) Assignee: DENSO CORPORATION, Kariya (JP)

( * ) Notice: Subject to any disclaimer, the term of this patent is extended or adjusted under 35 U.S.C. 154(b) by 549 days.

(21) Appl. No.: 13/348,951

(22) Filed: Jan. 12, 2012

(65) Prior Publication Data

US 2012/0176117 A1    Jul. 12, 2012

(30) Foreign Application Priority Data

Jan. 12, 2011    (JP) .................................. 2011-004108

(51) Int. Cl.
*H03K 17/08*    (2006.01)
*H03K 17/082*    (2006.01)

(52) U.S. Cl.
CPC ......... *H03K 17/0822* (2013.01); *H03K 17/08* (2013.01)

(58) Field of Classification Search
CPC ..... H03K 17/08; H03K 17/17; H03K 17/0822
USPC ........................................ 307/125, 130–131
See application file for complete search history.

(56) References Cited

U.S. PATENT DOCUMENTS

| 7,675,725 | B2* | 3/2010 | Matsuda | 361/90 |
|---|---|---|---|---|
| 8,427,225 | B2* | 4/2013 | Nakatake et al. | 327/427 |
| 8,497,728 | B2* | 7/2013 | Mizobe | H02P 29/02 326/83 |
| 2010/0213989 | A1* | 8/2010 | Nakatake et al. | 327/109 |
| 2011/0031955 | A1* | 2/2011 | Cheng et al. | 323/312 |
| 2012/0188001 | A1* | 7/2012 | Mizobe | H02P 29/02 327/427 |

FOREIGN PATENT DOCUMENTS

JP    2007-288856    11/2007

* cited by examiner

*Primary Examiner* — Adi Amrany
(74) *Attorney, Agent, or Firm* — Nixon & Vanderhye PC

(57) ABSTRACT

An electronic control apparatus includes a switching element; an ON-drive constant-current circuit supplying a constant current to the control terminal of the switching element thereby charging the control terminal of the switching element; an OFF-drive switching element discharging electrical charge from the control terminal of the switching element by being turned ON; and a control circuit adapted to control the ON-drive constant-current circuit and the OFF-drive switching element in response to a drive signal being inputted, thereby controlling the voltage of the control terminal of the switching element so as to drive the switching element. The control circuit controls the current control transistor based on the voltage of the current detection resistor and supplies the constant current to the control terminal of the switching element, and detects an abnormality in the ON-drive constant-current circuit based on the voltage of the current detection resistor.

13 Claims, 7 Drawing Sheets

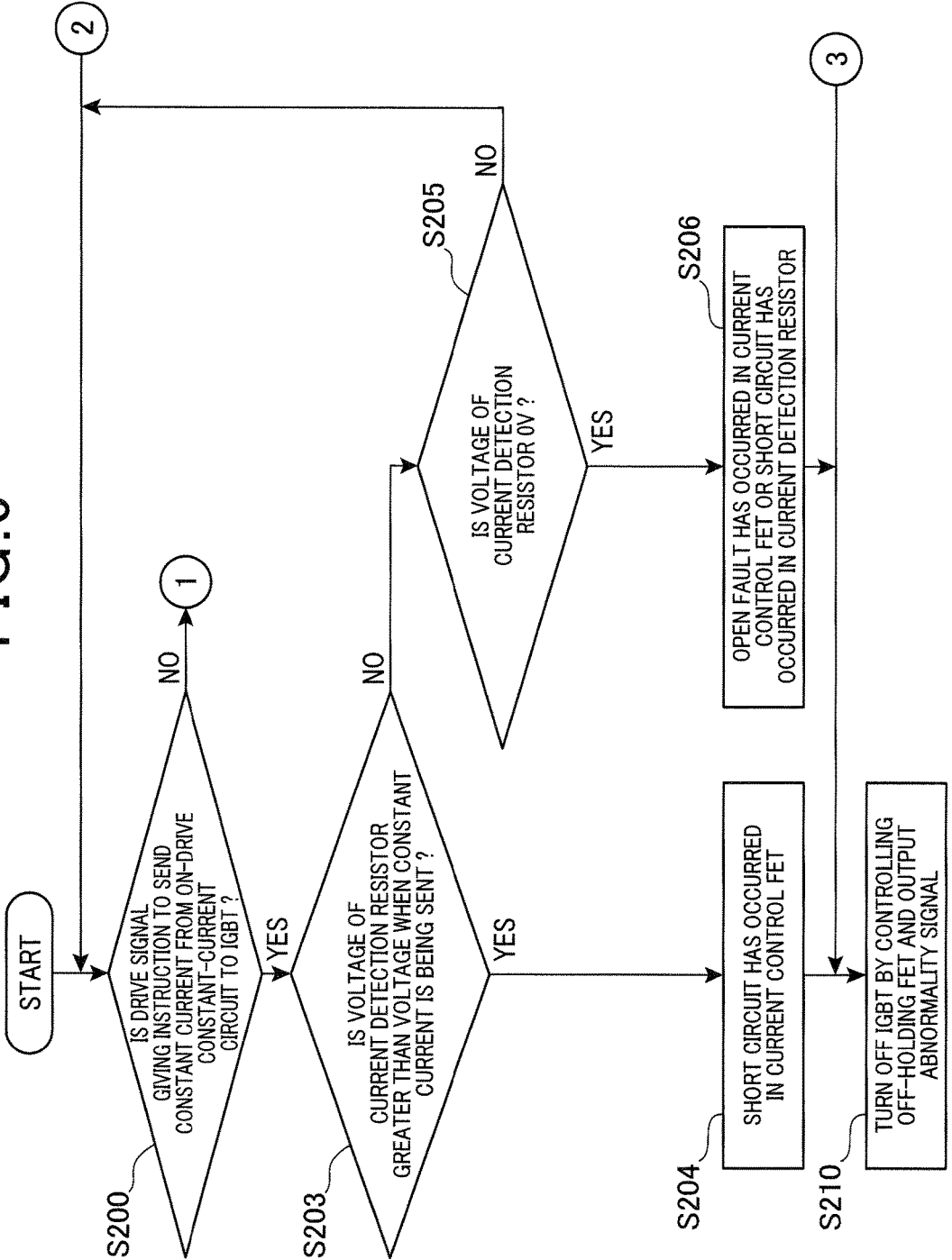

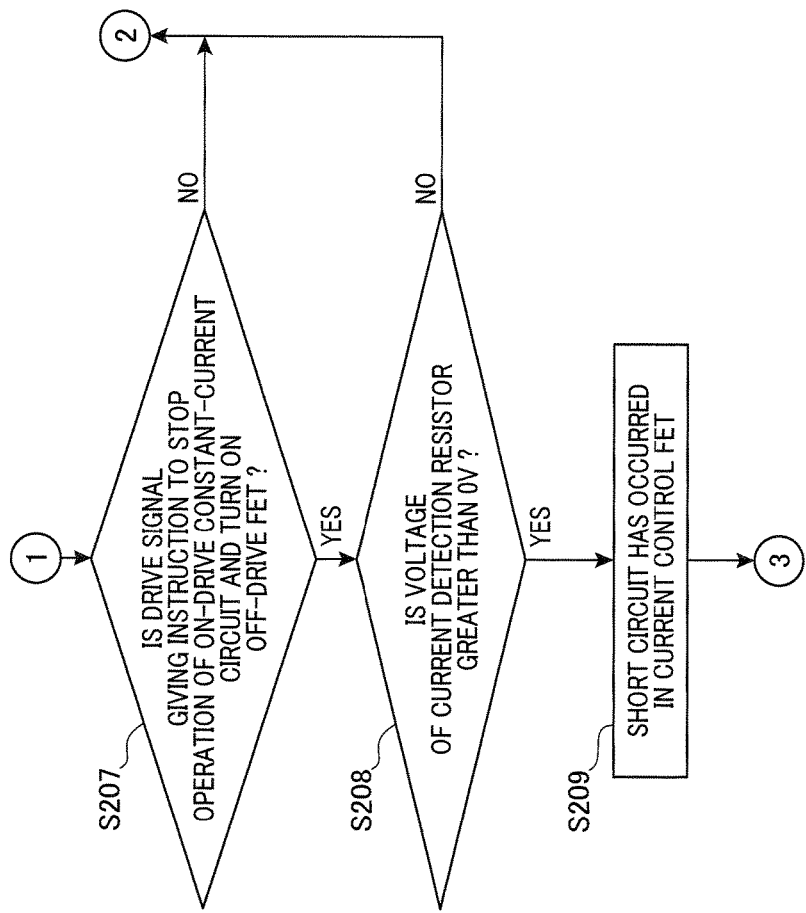

ELECTRONIC CONTROL APPARATUS HAVING SWITCHING ELEMENT AND DRIVE CIRCUIT

CROSS REFERENCE TO RELATED APPLICATION

This application is based on and claims the benefit of priority from earlier Japanese Patent Application No. 2011-4108 filed on Jan. 12, 2011 the description of which is incorporated herein by reference.

BACKGROUND

Technical Field

The present application relates to an electronic control apparatus for driving a motor, and more particularly to an electronic control apparatus including a switching element and a drive circuit.

Description of the Related Art

Conventionally, a motor drive circuit for driving a motor is known. For example, JP-A-2007-288856 discloses a motor drive unit described below as a conventional electronic control apparatus including a switching element and a drive circuit.

The motor drive unit includes a power transistor and a gate driver. The gate driver includes first and second current sources, a gate current controller, and a gate switching controller. The first current source is connected between a positive terminal of a circuit power supply and a gate of the power transistor. The second current source is connected between the gate of the power transistor and a negative terminal of the current power supply. The gate current controller is connected to the first and second current sources. The gate switching controller is connected to the gate current controller.

The gate current controller drives a first power transistor by controlling the first and second current sources based on signals inputted from the gate switching controller. When the signal inputted from the gate switching controller gives an instruction to turn ON the power transistor, the gate current controller controls the first current source and supplies a predetermined current to the gate of the first power transistor. As a result, the gate voltage becomes higher than an ON/OFF threshold voltage, and the power transistor is turned ON.

On the other hand, when the signal inputted from the gate switching controller gives an instruction to turn OFF the power transistor, the gate current controller controls the second current source and withdraws a predetermined sink-current from the gate of the power transistor. As a result, the gate voltage becomes lower than the ON/OFF threshold voltage, and the power transistor is turned OFF.

When an abnormality occurs in the first current source in the above-described motor drive unit, the gate voltage of the power transistor does not decrease. An abnormal state may occur in which the power transistor cannot be turned OFF. At this time, when the gate voltage of the power transistor is a voltage within a predetermined range near the ON/OFF threshold voltage, the drain-source voltage, or in other words, the ON voltage increases, and heat generation by the power transistor increases. When an abnormal state such as this continues, the power transistor may generate heat and thermal damage may occur.

SUMMARY

According to an embodiment, an electronic control apparatus is provided that is capable of detecting an abnormality in an ON-drive constant-current circuit that supplies a constant current to a control terminal of a switching element and charges the control terminal with electrical charge to turn ON the switching element.

Through keen research conducted to solve the above-described issues, the inventors of the present application have found that, in an ON-drive constant-current circuit configured by a constant-current output transistor and a current detection resistor that detects a current flowing to the constant-current output transistor, an abnormality in the ON-drive constant-current circuit can be detected based on the voltage of the current detection resistor.

A first aspect is an electronic control apparatus including: a switching element driven by a voltage of a control terminal being controlled; an ON-drive constant-current circuit connected to the control terminal of the switching element, supplying a constant current to the control terminal thereby charging the control terminal of the switching element with electrical charge, the ON-drive constant-current circuit including a current control transistor that controls the current supplied to the control terminal of the switching element and a current detection resistor that detects the current flowing to the current control transistor; an OFF-drive switching element connected to the control terminal of the switching element, discharging electrical charge from the control terminal of the switching element by being turned ON; and a control circuit adapted to control the ON-drive constant-current circuit and the OFF-drive switching element in response to a drive signal being inputted, thereby controlling the voltage of the control terminal of the switching element so as to drive the switching element. Moreover, the control circuit controls the current control transistor based on the voltage of the current detection resistor and supplies the constant current to the control terminal of the switching element, and detects an abnormality in the ON-drive constant-current circuit based on the voltage of the current detection resistor.

According to the configuration, when failure occurs in the current control transistor or the current detection resistor of the ON-drive constant-current circuit, the current flowing thereto and the voltage applied thereto change. Therefore, the abnormality in the ON-drive constant-current circuit can be detected based on the voltage of the current detection resistor.

According to a second aspect, in the electronic control apparatus, the control circuit detects an abnormality in the ON-drive constant-current circuit based on the drive signal and the voltage of the current detection resistor.

According to the configuration, when failure occurs in the current control transistor or the current detection resistor of the ON-drive constant-current circuit, the current flowing thereto and the voltage applied thereto change. Therefore, the abnormality in the ON-drive constant-current circuit can be detected based on the drive signal and the voltage of the current detection resistor.

According to a third aspect, in the electronic control apparatus, the control circuit determines that a short circuit has occurred in the current control transistor when the voltage across the current detection resistor is greater than the voltage when the constant current is being supplied, while the drive signal gives a command to supply the constant current from the ON-drive constant-current circuit to the control terminal of the switching element.

According to the configuration, when the drive signal gives the command to supply the constant current from the ON-drive constant-current circuit to the control terminal of the switching element, the voltage of the current detection resistor becomes a value based on the constant current being supplied. However, when a short circuit occurs in the current control transistor, a current greater than the constant current that is supplied during a normal state is sent. As a result, the voltage of the current detection resistor becomes greater than the voltage when the constant current is being supplied. Therefore, when the voltage of the current detection resistor is greater than the voltage when the constant current is being supplied, the judgment can be made that a short circuit has occurred in the current control transistor.

According to a fourth aspect, in the electronic control apparatus, the control circuit determines that an open fault has occurred in the current control transistor or a short circuit has occurred in the current detection resistor when the voltage across the current detection resistor is 0V, while the drive signal gives a command to supply the constant current from the ON-drive constant-current circuit to the control terminal of the switching element.

According to the configuration, when the drive signal gives the command to supply the constant current from the ON-drive constant-current circuit to the control terminal of the switching element, the voltage of the current detection resistor becomes a value based on the constant current being supplied. However, when an open fault occurs in the current control transistor, the current does not flow to the current detection resistor. As a result, the voltage of the current detection resistor becomes 0V. In addition, when a short circuit occurs in the current detection resistor, the voltage of the current detection resistor becomes 0V. Therefore, when the voltage of the current detection resistor is 0V, the judgment can be made that an open fault has occurred in the current control transistor or a short circuit has occurred in the current detection resistor.

According to a fifth aspect, in the electronic control apparatus, the control circuit determines that a short circuit has occurred in the current control transistor when the voltage across the current detection resistor is greater than 0V, while the drive signal gives a command to turn ON the OFF-drive switching element.

According to the configuration, when the drive signal gives the command to turn ON the OFF-drive switching element, the ON-drive constant-current circuit stops supplying the constant current. The voltage of the current detection resistor becomes 0V. However, when a short circuit occurs in the current control transistor, the current flows to the current detection resistor. As a result, the voltage of the current detection resistor becomes greater than 0V. Therefore, when the voltage of the current detection resistor is greater than 0V, the judgment can be made that a short circuit has occurred in the current control transistor.

According to a sixth aspect, in the electronic control apparatus, an input terminal of the current control transistor is connected to a positive terminal of the drive power supply circuit with the current detection resistor therebetween. An output terminal of the current control transistor is connected to the control terminal of the switching element and a connection point between the current control transistor and the current detection resistor is connected to a negative terminal of the drive power supply circuit with a reference potential connection resistor therebetween.

According to the configuration, when an abnormality occurs in the ON-drive constant-current circuit, the voltage of the connection point between the current control transistor and the current detection resistor can be prevented from becoming irregular. Therefore, the abnormality in the ON-drive constant current circuit can be detected with certainty based on the voltage of the current detection resistor.

According to a seventh aspect, in the electronic control apparatus, the control circuit determines that an open fault has occurred in the current detection resistor when the voltage across the current detection resistor is the voltage of the drive power supply circuit, while the drive signal gives a command to turn ON the OFF-drive switching element.

According to the configuration, when the drive signal gives the command to turn ON the OFF-drive switching element, the ON-drive constant-current circuit stops supplying the constant current and the voltage of the current detection resistor becomes 0V. However, when an open fault occurs in the current detection resistor, because one end is connected to the positive terminal of the drive power supply circuit and the other end is connected to the negative terminal of the drive power supply circuit with the reference potential connection resistor therebetween, the voltage of the current detection resistor becomes the voltage of the drive power supply circuit. Therefore, when the drive signal gives the command to turn ON the OFF-drive switching element, if the voltage of the current detection resistor is the voltage of the drive power supply circuit, the judgment can be made that an open fault has occurred in the current detection resistor.

According to an eighth aspect, in the electronic control apparatus, the control circuit determines that an open fault has occurred in the current control transistor when the voltage across the current detection resistor is equivalent to a voltage where a voltage of the drive power supply circuit is divided by the current detection resistor and the reference potential connection resistor, while the drive signal gives a command to supply the constant current from the ON-drive constant-current circuit to the control terminal of the switching element.

According to the configuration, when the drive signal gives the command to supply the constant current from the ON-drive constant-current circuit to the control terminal of the switching element, the voltage of the current detection resistor becomes a value based on the constant current being supplied. However, when an open fault occurs in the current control transistor, the current does not flow to the current detection resistor. Because one end of the current detection resistor is connected to the positive terminal of the drive power supply circuit and the other end is connected to the negative terminal of the drive power supply circuit with the reference potential connection resistor therebetween, the voltage of the current detection resistor becomes the voltage that is the voltage of the drive power supply circuit divided by the current detection resistor and the reference potential connection resistor. Therefore, when the voltage of the current detection resistor is the voltage that is the voltage of the drive power supply circuit divided by the current detection resistor and the reference potential connection resistor, the judgment can be made that an open fault has occurred in the current control transistor.

According to a ninth aspect, in the electronic control apparatus, the control circuit includes a current control circuit for controlling the current control transistor based on the voltage of the current detection resistor; and an abnormality detection circuit for detecting an abnormality in the ON-drive constant-current circuit based on the voltage of the current detection resistor. The wiring from the current detection resistor to the current control circuit and the wiring from the current detection resistor to the abnormality detection circuit are provided separately.

According to the configuration, the wiring from the current detection resistor to the current control circuit and the wiring from the current detection resistor to the abnormality detection circuit are provided separately without sharing a section of the wiring. Therefore, even when the wiring from the current detection resistor to the current control circuit becomes disconnected, the abnormality in the ON-drive constant-current circuit can be detected.

According to a tenth aspect, in the electronic control apparatus, the control circuit turns OFF the switching element by a component other than the OFF-drive switching element when an abnormality in the ON-drive constant-current circuit is detected.

According to the configuration, thermal damage to the switching element accompanying the abnormality in the ON-drive constant-current circuit can be prevented.

According to an eleventh aspect, the electronic control apparatus includes an OFF-holding switching element connected to the control terminal of the switching element and adapted to discharge electrical charge from the control terminal of the switching element by being turned ON. The control circuit is adapted to control the OFF-holding switching element such that when the voltage of the control terminal of the switching element becomes an OFF-holding threshold or less, the OFF-holding threshold being lower than an ON/OFF threshold voltage, the control circuit controls the OFF-holding switching element so as to hold the OFF-state of the switching element. When an abnormality in the ON-drive constant-current circuit is detected, the control circuit controls the OFF-holding switching element so as to turn OFF the switching element.

According to the configuration, when an abnormality is detected in the ON-drive constant-current circuit, the switching element is turned OFF by the OFF-holding switching element being controlled and electrical charge being discharged from the control terminal of the switching element. Therefore, thermal damage to the switching element can be prevented.

According to a twelfth aspect, in the electronic control apparatus, the control circuit outputs an abnormality signal when the control circuit detects an abnormality in the ON-drive constant-current circuit.

According to the configuration, external notification of the abnormality in the ON-drive constant current circuit can be given.

BRIEF DESCRIPTION OF THE DRAWINGS

In the accompanying drawings:

FIG. 6 is a flowchart for describing an abnormality detection operation of an ON-drive constant-current circuit according to the second embodiment; and FIG. 7 is another flowchart for describing the abnormality detection operation of the ON-drive constant-current circuit according to the second embodiment.

DETAILED DESCRIPTION OF THE PREFERRED EMBODIMENTS

The present application will hereinafter be described in further detail according to embodiments. According to the present embodiments, an example is given in which an electronic control apparatus of the present application is applied to a motor control apparatus that is mounted in a vehicle and controls a vehicle-drive motor.

First Embodiment

A first embodiment of the subject application will hereinafter be described with reference to FIG. 1 to FIG. 4.

First, a configuration of a motor control apparatus according to the first embodiment will be described with reference to FIG. 1. Here, FIG. 1 is a circuit diagram of the motor control apparatus according to the first embodiment.

Figure 1:
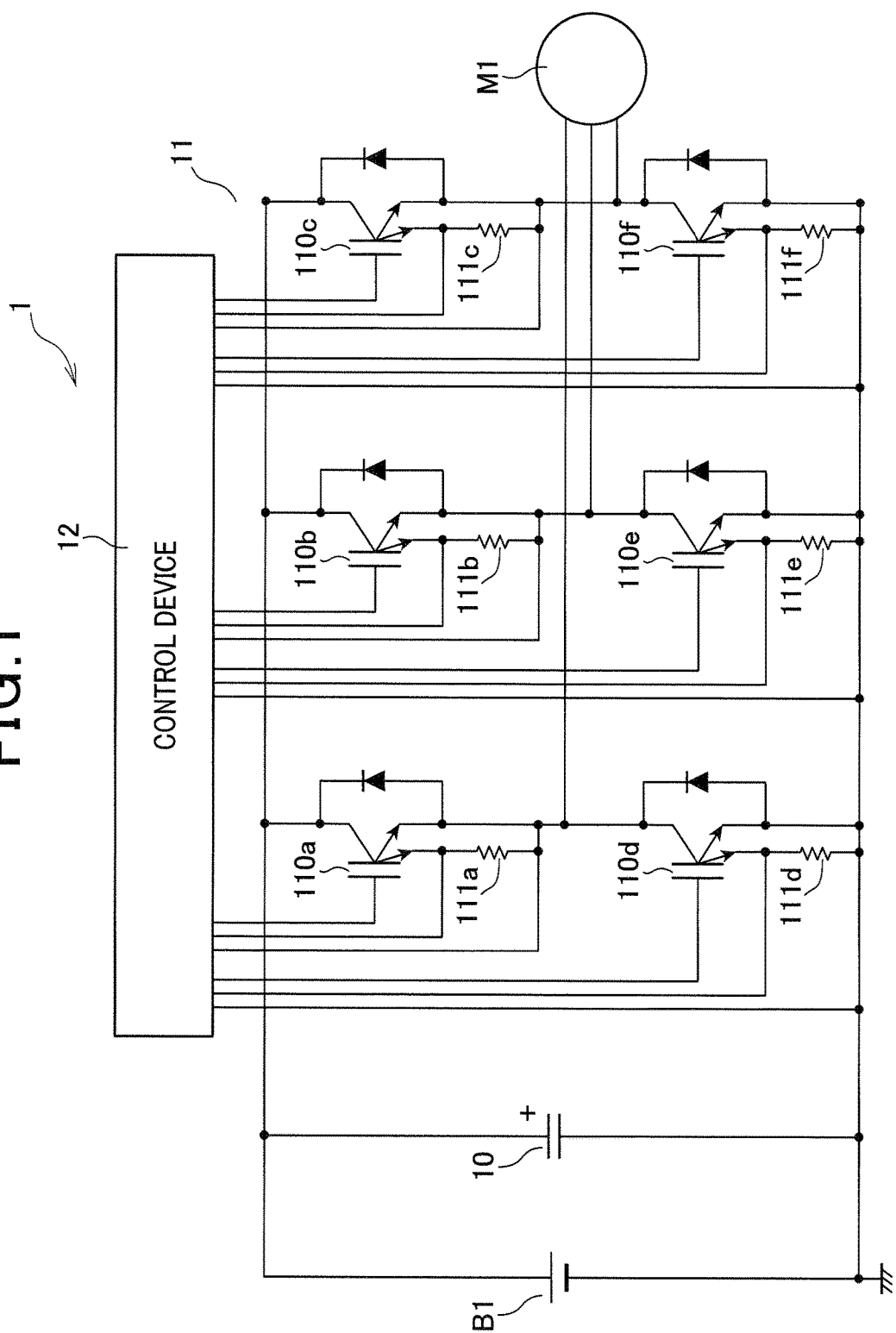
FIG. 1 is a circuit diagram of a motor control apparatus according to a first embodiment.

A motor control apparatus 1 (electronic control apparatus) shown in FIG. 1 is a device that controls a vehicle-drive motor M1 by converting high direct-current voltage (such as 288V) outputted from a high-voltage battery B1 insulated from the vehicle body to three-phase alternating-current voltage, and supplying the three-phase alternating current voltage to the vehicle-drive motor M1. The motor control apparatus 1 includes a smoothing capacitor 10, an inverter device 11, and a control device 12.

The smoothing capacitor 10 is an element used to smooth the high direct-current voltage of the high-voltage battery B1. One end of the smoothing capacitor 10 is connected to the positive terminal of the high-voltage battery B1, and the other end is connected to the negative terminal of the high-voltage battery B1. Furthermore, the negative terminal of the high-voltage battery B1 is connected to a high-voltage-battery ground that is insulated from the vehicle body.

The inverter device 11 is a device that converts the direct-current voltage smoothened by the smoothing capacitor 10 to the three-phase alternating-current voltage, and supplies the three-phase alternating-current voltage to the vehicle-drive motor M1. The inverter device 11 includes insulated-gate bipolar transistors (IGBTs) 110a to 110f (switching elements) and current-sensing resistors 111a to 111f.

The IGBTs 110a to 110f are switching elements that are driven by the voltage of the gate (control terminal) being controlled, and are used to convert the direct-current voltage smoothened by the smoothing capacitor 10 to the three-phase alternating-current voltage by being turned ON and OFF. The IGBTs 110a to 110f each include a current-sensing terminal through which a current smaller than a collector current flows, in proportion with the collector current. The IGBTs 110a and 110d, the IGBTs 110b and 110e, and the IGBTs 110c and 110f are each connected in series. Specifically, the emitters of the IGBTs 110a to 110c are respectively connected to the collectors of the IGBTs 110d to 110f. The three pairs of serially connected IGBTs, namely the IGBTs 110a and 110d, the IGBTs 110b and 110e, and the IGBTs 110c and 110f, are connected in parallel. The collectors of the IGBTs 110a to 110c are connected to one end of the smoothing capacitor 10. The emitters of the IGBTs 110d to 110f are connected to the other end of the smoothing capacitor 10. In addition, the gates and emitters of the IGBTs 110a to 110f are each connected to the control device 12. Furthermore, the serial connection points of the serially connected IGBTs 110a and 110d, IGBTs 110b and 110e, and IGBTs 110c and 110f are each connected to the vehicle-drive motor M1.

The current-sensing resistors 111a to 111f are elements used to convert the current flowing to the IGBTs 110a to 110f to voltage. Specifically, the current-sensing resistors 111a to 111f are elements that convert the current flowing to the current-sensing terminals to voltage. One end of each current-sensing resistor 111a to 111f is connected to the current-sensing terminal of the corresponding IGBT 110a to 110f, and the other end is connected to the emitter of the corresponding IGBT 110a to 110f. Both ends of each current-sensing resistor 111a to 111f are connected to the control device 12.

The control device 12 is a device that controls the IGBTs 110a to 110f. The control device 12 is connected to the gate and emitter of each IGBT 110a to 110f. In addition, the control device 12 is also connected to both ends of each current-sensing resistor 111a to 111f to detect the current flowing to the IGBTs 110a to 110f.

Figure 2:
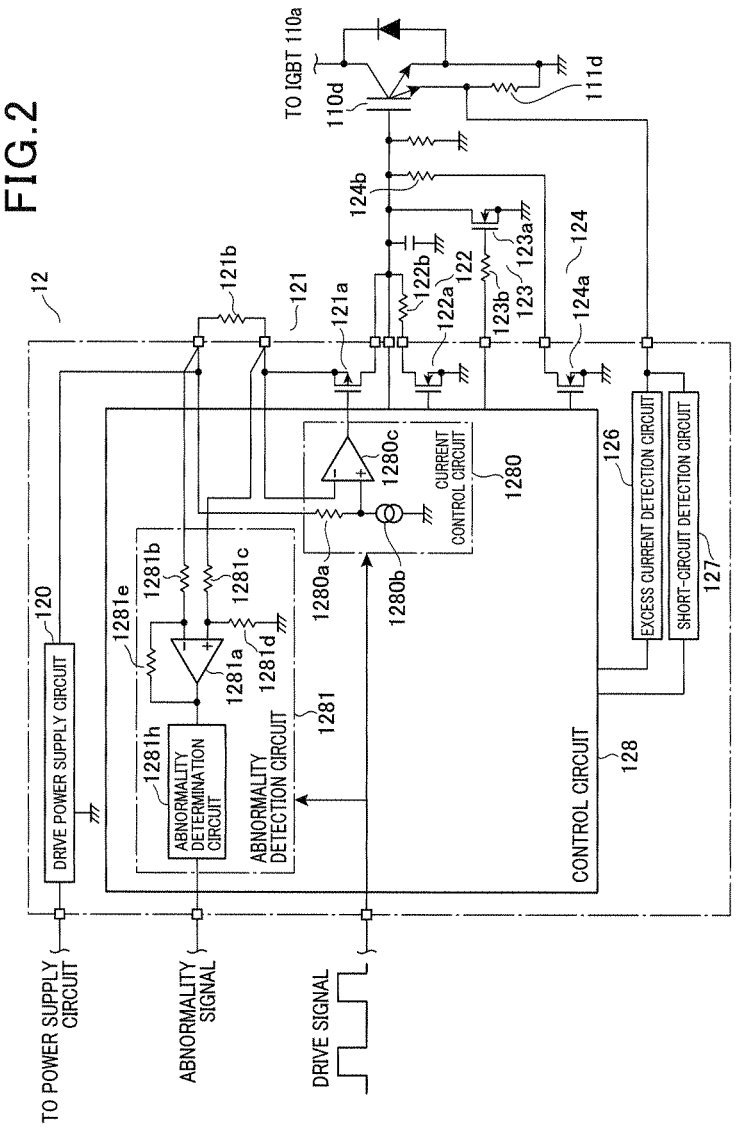
FIG. 2 is a circuit diagram of a control device in FIG. 1.

Next, the control device 12 will be described in detail with reference to FIG. 2. Here, FIG. 2 is a circuit diagram of the control device 12 in FIG. 1. Specifically, FIG. 2 is a circuit diagram of a circuit section for one IGBT.

As shown in FIG. 2, the control device 12 includes, for the IGBT 110d, a drive power supply circuit 120, an ON-drive constant-current circuit 121, an OFF-drive circuit 122, an OFF-holding circuit 123, a blocking circuit 124, an excess current detection circuit 126, a short-circuit detection circuit 127, and a control circuit 128. The control device 12 similarly includes a drive power supply circuit, an ON-drive constant-current circuit, an OFF-drive circuit, an OFF-holding circuit, a blocking circuit, an excess current detection circuit, a short-circuit detection circuit, and a control circuit for each of the other IGBTs 110a to 110c, 110e, and 110f.

The drive power supply circuit 120 is a circuit that supplies a voltage for driving the IGBT 110d. The drive power supply circuit 120 stabilizes the voltage supplied from a power supply circuit (not shown) and outputs the stabilized voltage. The input terminal of the drive power supply circuit 120 is connected to the power supply circuit. The positive terminal is connected to the ON-drive constant-current circuit 121. The negative terminal is connected to the high-voltage-battery ground that is insulated from the vehicle body, and is connected to the emitter of the IGBT 110d with the high-voltage-battery ground therebetween.

The ON-drive constant-current circuit 121 is a circuit used to turn ON the IGBT 110d. Specifically, the ON-drive constant-current circuit 121 charges the gate of the IGBT 110d with electrical charge by supplying a predetermined constant current thereto, increases the gate voltage to become higher than an ON/OFF threshold voltage, and turns ON the IGBT 110d. The ON-drive constant-current circuit 121 includes a current control field-effect transistor (FET) 121a (current control transistor) and a current detection resistor 121b.

The current control FET 121a is an element that is driven by the voltage of the gate being controlled, and charges the gate of the IGBT 110d with electrical charge by sourcing a predetermined constant current. Specifically, the current control FET 121a is a P-channel metal-oxide-semiconductor field-effect transistor (MOSFET). The current detection resistor 121b is an element that detects the current supplied to the IGBT 110d. The source (input terminal) of the current control FET 121a is connected to the positive terminal of the drive power supply circuit 120 with the current detection resistor 121b therebetween. The drain (output terminal) is connected to the gate of the IGBT 110d. Furthermore, the gate is connected to the control circuit 128.

The OFF-drive circuit 122 is a circuit used to turn OFF the IGBT 110d. Specifically, the OFF-drive circuit 122 discharges electrical charge from the gate of the IGBT 110d, decreases the gate voltage to become lower than the ON/OFF threshold voltage, and turns OFF the IGBT 110d.

The OFF-drive circuit 122 includes an OFF-drive FET 122a (OFF-drive switching element) and an OFF-drive resistor 122b.

The OFF-drive FET 122a is a switching element that is driven by the voltage of the gate being controlled, and discharges electrical charge from the gate of the IGBT 110d by being turned ON. Specifically, the OFF-drive FET 122a is an N-channel MOSFET. The source of the OFF-drive FET 122a is connected to the high-voltage-battery ground that is insulated from the vehicle body, and is connected to the negative terminal of the drive power supply circuit 120 and the emitter of the IGBT 110d with the high-voltage-battery ground therebetween. The drain is connected to the gate of the IGBT 110d with the OFF-drive resistor 122b therebetween. Furthermore, the gate is connected to the control circuit 128.

The OFF-holding circuit 123 is a circuit that holds the OFF-state of the IGBT 110d. Specifically, when the gate voltage of the IGBT 110d reaches an OFF-holding threshold or lower, the OFF-holding threshold being lower than the ON/OFF threshold voltage, the OFF-holding circuit 123 discharges electrical charge from the gate of the IGBT 110d more quickly than the OFF-drive circuit 122. The OFF-holding circuit 123 decreases the gate voltage to become lower than the ON/OFF threshold voltage, and holds the OFF-state of the IGBT 110d. The OFF-holding circuit 123 includes an OFF-holding FET 123a (OFF-holding switching element) and a gate resistor 123b.

The OFF-holding FET 123a is a switching element that is driven by the voltage of the gate being controlled, and discharges electrical charge from the gate of the IGBT 110d by being turned ON. Specifically, the OFF-holding FET 123a is an N-channel MOSFET. The source of the OFF-holding FET 123a is connected to the high-voltage-battery ground that is insulated from the vehicle body, and is connected to the negative terminal of the drive power supply circuit 120 and the emitter of the IGBT 110d with the high-voltage-battery ground therebetween. The drain is connected to the gate of the IGBT 110d. Furthermore, the gate is connected to the control circuit 128 with the gate resistor 123b therebetween.

The blocking circuit 124 is a circuit that turns OFF the IGBT 110d in place of the OFF-drive circuit 122 when an abnormality occurs. Specifically, when an abnormality such as excess current or a short-circuit occurs, the blocking circuit 124 discharges electrical charge from the gate of the IGBT 110d more gradually than the OFF-drive circuit 122. The block circuit 124 decreases the gate voltage to become lower than the ON/OFF threshold voltage, and turns OFF the IGBT 110d in place of the OFF-drive circuit 122. The blocking circuit 124 includes a blocking FET 124a and a blocking resistor 124b.

The blocking FET 124a is a switching element that is driven by the voltage of the gate being controlled, and discharges electrical charge from the gate of the IGBT 110d by being turned ON. Specifically, the blocking FET 124a is an N-channel MOSFET. The source of the blocking FET 124a is connected to the high-voltage-battery ground that is insulated from the vehicle body, and is connected to the negative terminal of the drive power supply circuit 120 and the emitter of the IGBT 110d with the high-voltage-battery ground therebetween. The drain is connected to the gate of the IGBT 110d with the blocking resistor 124b therebetween. Furthermore, the gate is connected to the control circuit 128.

The excess current detection circuit 126 is a circuit that detects whether or not an excess current is flowing to the IGBT 110*d*. Specifically, when the current flowing to the IGBT 110*d* becomes greater than an excess current threshold, the excess current detection circuit 126 determines that an excess current is flowing to the IGBT 110*d*. The input terminal of the excess current detection circuit 126 is connected to one end of the current-sensing resistor 111*d*. The output terminal is connected to the control circuit 128.

The short-circuit detection circuit 127 is a circuit that detects whether or not the IGBT 110*d* is in a short-circuit state. Specifically, when the current flowing to the IGBT 110*d* becomes greater than a short-circuit current threshold that is greater than the excess current threshold, a short-circuit state occurs in which both IGBT 110*a* and IGBT 110*d* are turned ON. The short-circuit detection circuit 127 determines that a short-circuit current is flowing to the IGBT 110*d*. The input terminal of the short-circuit detection circuit 127 is connected to one end of the current-sensing resistor 111*d*. The output terminal is connected to the control circuit 128.

The control circuit 128 controls the ON-drive constant-current circuit 121 and the OFF-drive circuit 122 based on a drive signal inputted from an external source, and drives the IGBT 110*d*. In addition, the control circuit 128 controls the OFF-holding circuit 123 based on the gate voltage of the IGBT 110*d*, and holds the OFF-state of the IGBT 110*d*. Furthermore, the control circuit 128 detects an abnormality in the ON-drive constant-current circuit 121 based on the drive signal and the voltage of the current detection resistor 121*b*. The control circuit 128 controls a component other than the OFF-drive FET 122*a* (other than the OFF-drive switching element), or specifically, controls the OFF-holding FET 123*a* and turns OFF the IGBT 110*d*. The control circuit 128 also outputs an abnormality signal outside. Furthermore, when an abnormality occurs, such as an excess current flowing to the IGBT 110*d* or the IGBT 110*d* entering the short-circuit state, the control circuit 128 controls the blocking circuit 124 instead of the OFF-drive circuit 122 and turns OFF the IGBT 110*d*. The control circuit 128 is connected to respective gates of the current control FET 121*a* and the OFF-drive FET 122*a*. The control circuit 128 is also connected to the gate of the IGBT 110*d*, and to the gate of the OFF-holding FET 123*a* with the gate resistor 123*b* therebetween. The control circuit 128 is also connected to both ends of the current detection resistor 121*b*. In addition, the control circuit 128 is connected to respective output terminals of the excess current detection circuit 126 and the short-circuit detection circuit 127, and the gate of the blocking FET 124*a*.

The drive power supply circuit 120, the current control FET 121*a*, the OFF-drive FET 122*a*, the blocking FET 124*a*, the excess current detection circuit 126, the short-circuit detection circuit 127, and the control circuit 28 are integrally configured as an integrated circuit (IC).

The control circuit 128 includes a current control circuit 1280 and an abnormality detection circuit 1281.

The current control circuit 1280 is a circuit that controls the ON-drive constant-current circuit 121. Specifically, when a drive signal gives a command to turn ON the IGBT 110*d*, the current control circuit 1280 controls the current control FET 121*a* based on the voltage of the current detection resistor 121*b*. More specifically, when the drive signal gives a command to supply the constant current from the ON-drive constant-current circuit 121 to the gate of the IGBT 110*d*, the current control circuit 1280 controls the current control FET 121*a* based on the voltage of the current detection resistor 121*b*. The current control circuit 1280 includes a resistor 1280*a*, a constant current source 1280*b*, and an operational amplifier 1280*c*.

The resistor 1280*a* and the constant current source 1280*b* are connected in series. One end of the resistor 1280*a* is connected to one end of the current detection resistor 121*b* connected to the drive power supply circuit 120. One end of the constant current source 1280*b* is connected to the high-voltage-battery ground that is insulated from the vehicle body, and is connected to the negative terminal of the drive power supply circuit 120 with the high-voltage battery ground therebetween.

The non-inverting input terminal of the operational amplifier 1280*c* is connected to the connection point between the resistor 1280*a* and the constant current source 1280*b*. The inverting input terminal is connected to the connection point between the current detection resistor 121*b* and the current control FET 121*a*. Furthermore, the output terminal is connected to the gate of the current control FET 121*a*.

The abnormality detection circuit 1281 is a circuit that detects an abnormality in the ON-drive constant-current circuit 121 based on the voltage of the current detection resistor 121*b*. The abnormality detection circuit 1281 includes an operational amplifier 1281*a*, resistors 1281*b* to 1281*e*, and an abnormality determination circuit 1281*f*.

The operational amplifier 1281*a* and the resistors 1281*b* to 1281*e* configure a differential amplifier circuit. The inverting input terminal of the operational amplifier 1281*a* is connected to one end of the current detection resistor 121*b* connected to the drive power supply circuit 120, with the resistor 1281*b* therebetween. Here, the wiring from the resistor 1281*b* to the current detection resistor 121*b* is provided separately from the wiring from the resistor 1280*a* of the current control circuit 1280 to the current detection resistor 121*b*, without sharing a section of the wiring. The non-inverting input terminal of the operational amplifier 1281*a* is connected to the connection point between the current detection resistor 121*b* and the current control FET 121*a*, with the resistor 1281*c* therebetween. In addition, the non-inverting input terminal is connected to the high-voltage-battery ground that is insulated from the vehicle body with the resistor 1281*d* therebetween, and connected to the negative terminal of the drive power supply circuit 120 with the high-voltage-battery ground therebetween. Here, the wiring from the resistor 1281*c* to the current detection resistor 121*b* is provided separately from the wiring from the operational amplifier 1280*c* of the current control circuit 1280 to the current detection resistor 121*b*, without sharing a section of the wiring. As a result, the connection point between the current control FET 121*a* and the current detection resistor 121*b* is connected to the negative terminal of the drive power supply circuit 120 with the resistors 1281*c* and 1281*d* (reference potential connection resistor) therebetween. The output terminal of the operational amplifier 1281*a* is connected to the inverting input terminal with the resistor 1281*e* therebetween, and is also connected to the abnormality determination circuit 1281*f*.

The abnormality determination circuit 1281*f* is a circuit that determines the abnormality in the ON-drive constant-current circuit 121 based on the output from the operational amplifier 1281*a* and outputs an abnormality signal. The input terminal of the abnormality determination circuit 1281*f* is connected to the output terminal of the operational amplifier 1281*a*.

Next, operations of the motor control apparatus 1 will be described with reference to FIG. 1. When an ignition switch (not shown) of the vehicle is turned ON, the motor control apparatus 1 shown in FIG. 1 starts operation. The high direct-current voltage from the high-voltage battery B1 is smoothened by the smoothing capacitor 10. The control device 12 controls the IGBTs 110a to 110f configuring the inverter device 11 based on a drive signal inputted from an external source. Specifically, the control device 12 turns ON and OFF the IGBTs 110a to 110f at a predetermined interval. The inverter device 11 converts the high direct-current voltage smoothened by the smoothing capacitor 10 to three-phase alternating-current voltage and supplies the three-phase alternating-current voltage to the vehicle drive motor M1. In this way, the motor control apparatus 1 controls the vehicle drive motor M1.

Next, driving operations of the IGBT will be described with reference to FIG. 2. As shown in FIG. 2, the control circuit 128 controls the current control FET 121a and the OFF-drive FET 122a based on a drive signal inputted from an external source, and drives the IGBT 110d.

When the drive signal gives a command to turn ON the IGBT 110d, or in other words, gives an instruction to supply the constant current from the ON-drive constant-current circuit 121 to the gate of the IGBT 110d and turn OFF the OFF-drive FET 122a, the control circuit 128 controls the current control FET 121a based on the voltage of the current detection resistor 121b, supplies the constant current to the gate of the IGBT 110d, and turns OFF the OFF-drive FET 122a. As a result, a constant current that is the same as the output current of the constant current source 1280b is supplied from the ON-drive constant-current circuit 121 to the gate of the IGBT 110d, and the gate is charged with electrical charge. Therefore, the gate voltage becomes higher than the ON/OFF threshold voltage, and the IGBT 110d is turned ON.

On the other hand, when the drive signal gives a command to turn OFF the IGBT 110d, or in other words, gives an instruction to stop operation of the ON-drive constant-current circuit 121 and turn ON the OFF-drive FET 122a, the control circuit 128 stops the operation of the ON-drive constant-current circuit 121 and turns ON the OFF-drive FET 122a. As a result, electrical charge is discharged from the gate of the IGBT 110d via the OFF-drive resistor 122b. Therefore, the gate voltage becomes lower than the ON/OFF threshold voltage, and the IGBT 110d is turned OFF. Then, when the gate voltage reaches the OFF-holding threshold or lower, the OFF-holding threshold being lower than the ON/OFF threshold voltage, the control circuit 128 turns ON the OFF-holding FET 123a. As a result, electrical charge is further discharged from the gate of the IGBT 110d via the OFF-holding FET 123a, and the OFF-state of the IGBT 110d is held.

When the current flowing to the IGBT 110d becomes greater than the excess current threshold, the excess current detection circuit 126 determines that an excess current is flowing to the IGBT 110d. When the current flowing to the IGBT 110d becomes greater than the short-circuit current threshold, the short-circuit detection circuit 127 determines that a short-circuit state has occurred in which both the IGBT 110a and the IGBT 110d are turned ON. When determined that an abnormality has occurred, such as an excess current flowing to the IGBT 110d or the IGBT 110d entering the short-circuit state, the control circuit 128 turns ON the blocking FET 124a instead of the OFF-drive FET 122a. As a result, electrical charge is discharged from the gate of the IGBT 110d via the blocking resistor 124b. Therefore, the gate voltage becomes lower than the ON/OFF threshold voltage more gradually than when decreased by the OFF-drive circuit 122, and the IGBT 110d is turned OFF.

Figure 3:
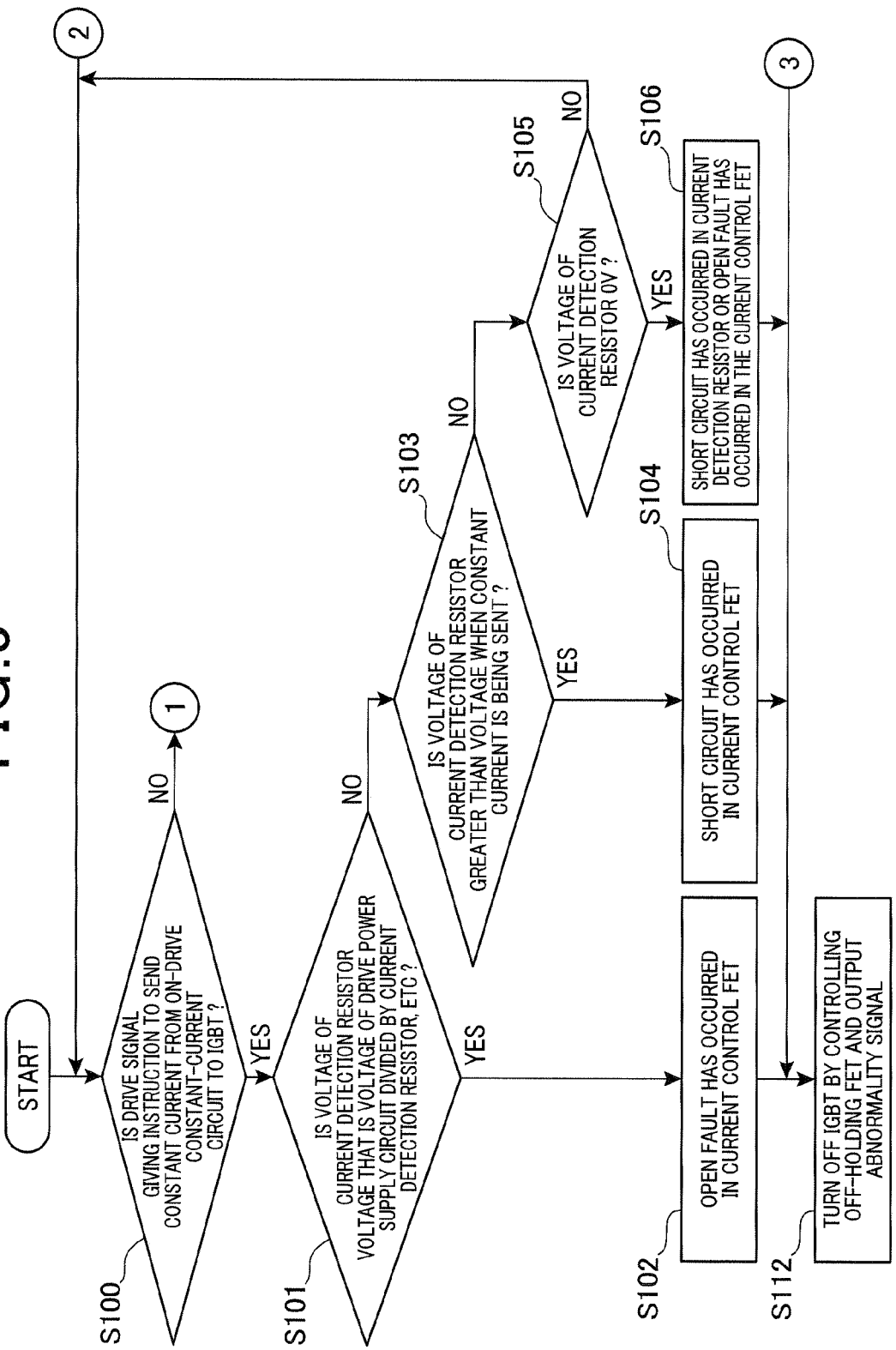
FIG. 3 is a flowchart for describing an abnormality detection operation of an ON-drive constant-current circuit according to the first embodiment.
Figure 4:
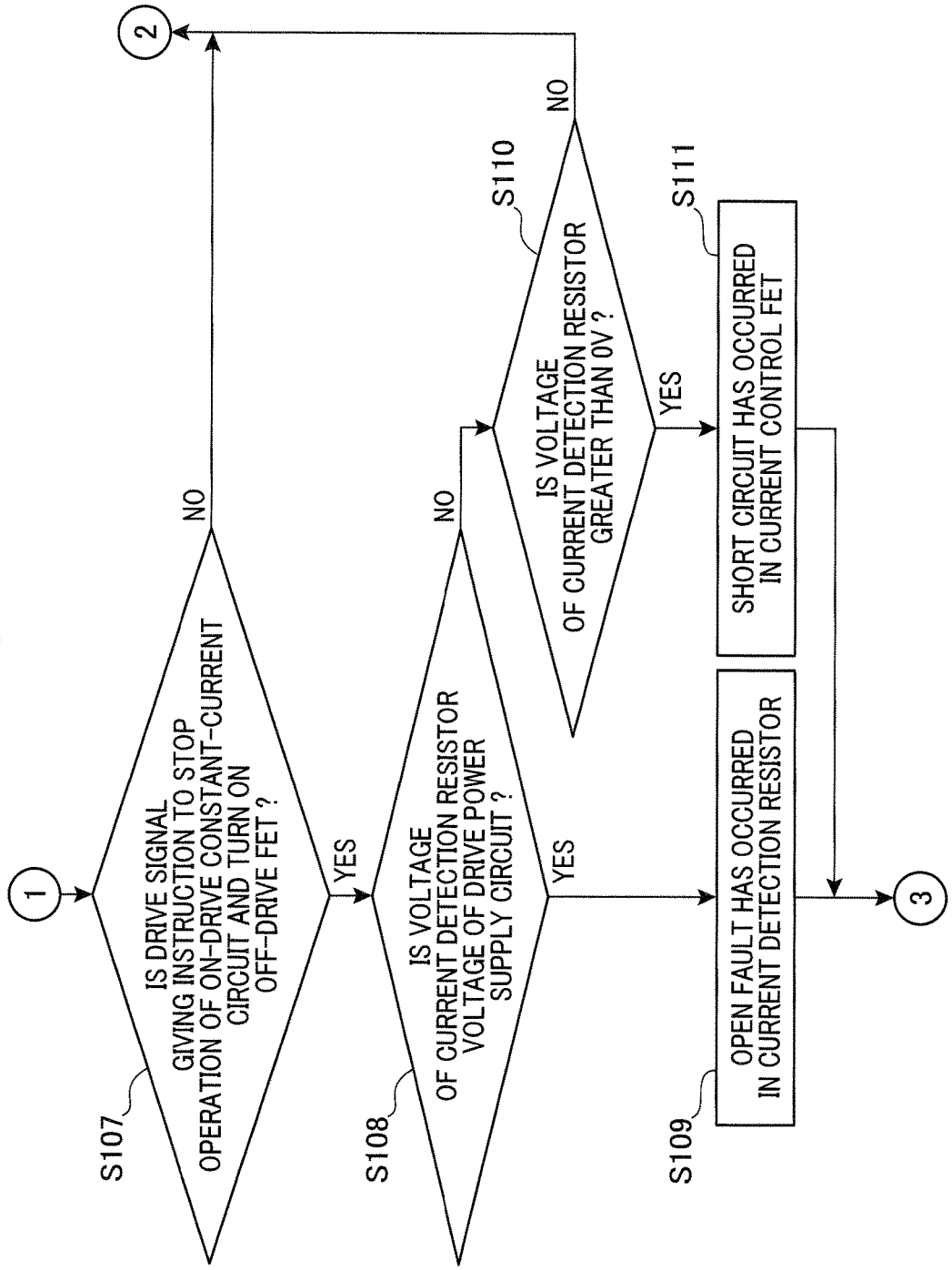
FIG. 4 is another flowchart for describing the abnormality detection operation of the ON-drive constant-current circuit according to the first embodiment.

Next, an abnormality detection operation of the ON-drive constant-current circuit 121 will be described with reference to FIG. 2 to FIG. 4. Here, FIG. 3 is a flowchart for describing the abnormality detection operation of the ON-drive constant-current circuit 121 according to the first embodiment. FIG. 4 is another flowchart describing the abnormality detection operation of the ON-drive constant-current circuit 121 according to the first embodiment.

The differential amplifier circuit configured by the operational amplifier 1281a and the resistors 1281b to 1281e in FIG. 2 amplifies the voltage of the current detection resistor 121b. As shown in FIG. 3, when the drive signal gives a command to turn ON the IGBT 110d, or in other words, to supply the constant current from the ON-drive constant-current circuit 121 to the gate of the IGBT 110d (S100), if the voltage of the current detection resistor 121b is a voltage that is the voltage of the drive power supply circuit 120 divided by the current detection resistor 121b and the resistors 1281c and 1281d (S101), the abnormality determination circuit 1281f determines that an open fault has occurred in the current control FET 121a (S102). If the voltage of the current detection resistor 121b is greater than the voltage when the constant current is being supplied (S103), the abnormality determination circuit 1281f determines that a short circuit has occurred in the current control FET 121a (S104). If the voltage of the current detection resistor 121b is 0V (S105), the abnormality determination circuit 1281f determines that a short circuit has occurred in the current detection resistor 121b or an open fault has occurred in the current control FET 121a (S106). The abnormality determination circuit 1281f returns to Step S100 in instances other than those above, and repeats similar processes.

On the other hand, as shown in FIG. 4, when the drive signal gives a command to turn OFF the IGBT 110d, or in other words, to stop the operation of the ON-drive constant-current circuit 121 and turn ON the OFF-drive FET 122a (S107), if the voltage of the current detection resistor 121b is the voltage of the drive power supply circuit 120 (S108), the abnormality determination circuit 1281f determines that an open fault has occurred in the current detection resistor 121b (Step 109). If the voltage of the current detection resistor 121b is greater than 0V (S110), the abnormality determination circuit 1281f determines than a short circuit has occurred in the current control FET 121a (S111). The abnormality determination circuit 1281f returns to Step S100 in instances other than those above, and repeats similar processes.

When determined that failure has occurred in at least either of the current control FET 121a and the current detection resistor 121b, as shown in FIG. 3, the control circuit 128 controls a component other than the OFF-drive FET 122a, or specifically, controls the OFF-holding FET 123a and turns OFF the IGBT 110d. The control circuit 128 also outputs the abnormality signal via the abnormality determination circuit 1281f (S112).

Next, effects will be described. According to the first embodiment, the control circuit 128 detects an abnormality in the ON-drive constant-current circuit 121 based on the voltage of the current detection resistor 121b, or specifically, a drive signal and the voltage of the current detection resistor 121b. When failure occurs in the current control FET 121a or the current detection resistor 121b of the ON-drive constant-current circuit 121, the current flowing thereto and the voltage applied thereto change. The current flowing thereto and the voltage applied thereto also change depending on the state of the drive signal. Therefore, the abnormality in the ON-drive constant-current circuit 121 can be detected based on the voltage of the current detection resistor 121b, or specifically, the drive signal and the voltage of the current detection resistor 121b.

According to the first embodiment, when the drive signal gives a command to supply the constant current from the ON-drive constant-current circuit 121 to the gate of the IGBT 110d, if the voltage of the current detection resistor 121b is greater than the voltage when the constant current is being supplied, the control circuit 128 determines that a short circuit has occurred in the current control FET 121a. When the drive signal gives the command to supply the constant current from the ON-drive constant-current circuit 121 to the gate of the IGBT 110d, the voltage of the current detection resistor 121b becomes a value based on the constant current. However, when a short circuit occurs in the current control FET 121a, a current that is greater than the constant current supplied in a normal state is sent. As a result, the voltage of the current detection resistor 121b becomes greater than the voltage when the constant current is being supplied. Therefore, when the voltage of the current detection resistor 121b is greater than the voltage when the constant current is being supplied, the judgment can be made that a short circuit has occurred in the current control FET 121a.

According to the first embodiment, when the drive signal gives a command to supply the constant current from the ON-drive constant-current circuit 121 to the gate of the IGBT 110d, if the voltage of the current detection resistor 121b is 0V, the control circuit 128 determines that an open fault has occurred in the current control FET 121a or a short circuit has occurred in the current detection resistor 121b. When the drive signal gives the command to supply the constant current from the ON-drive constant-current circuit 121 to the gate of the IGBT 110d, the voltage of the current detection resistor 121b becomes a value based on the constant current being supplied. However, when an open fault occurs in the current control FET 121a, the current does not flow to the current detection resistor 121b. As a result, the voltage of the current detection resistor 121b becomes 0V. In addition, when a short circuit occurs in the current detection resistor 121b as well, the voltage of the current detection resistor 121b becomes 0V. Therefore, when the voltage of the current detection resistor 121b is 0V, the judgment can be made that an open fault has occurred in the current control FET 121a or a short circuit has occurred in the current detection resistor 121b.

According to the first embodiment, when the drive signal gives a command to turn ON the OFF-drive FET 122a, if the voltage of the current detection resistor 121b is greater than 0V, the control circuit 128 determines that a short circuit has occurred in the current control FET 121a. When the drive signal gives the command to turn ON the OFF-drive FET 122a, the ON-drive constant-current circuit stops supplying the constant current. The voltage of the current detection resistor 121b becomes 0V. However, when a short circuit occurs in the current control FET 121a, the current flows to the current detection resistor 121b. As a result, the voltage of the current detection resistor 121b becomes greater than 0V. Therefore, when the voltage of the current detection resistor 121b is greater than 0V, the judgment can be made that a short circuit has occurred in the current control FET 121a.

According to the first embodiment, the source of the current control FET 121a is connected to the positive terminal of the drive power supply circuit 120 with the current detection resistor 121b therebetween. The drain is connected to the gate of the IGBT 110d. The connection point between the current control FET 121a and the current detection resistor 121b is connected to the negative terminal of the drive power supply circuit 120 with the resistors 1281c and 1281d therebetween. As a result, when an abnormality occurs in the ON-drive constant-current circuit 121, the voltage of the connection point between the current control FET 121a and the current detection resistor 121b can be prevented from becoming irregular. Therefore, the abnormality in the ON-drive constant-current circuit 121 can be detected with certainty based on the voltage of the current detection resistor 121b.

According to the first embodiment, when the drive signal gives a command to turn ON the OFF-drive FET 122a, if the voltage of the current detection resistor 121b is the voltage of the drive power supply circuit 120, the control circuit 128 determines that an open fault has occurred in the current detection resistor 121b. When the drive signal gives the command to turn ON the OFF-drive FET 122a, the ON-drive constant-current circuit 121 stops supplying the constant current and the voltage of the current detection resistor 121b becomes 0V. However, when an open fault occurs in the current detection resistor 121b, because one end is connected to the positive terminal of the drive power supply circuit 120 and the other end is connected to the negative terminal of the drive power supply circuit 120 with the resistors 1281c and 1281d therebetween, the voltage of the current detection resistor 121b becomes the voltage of the drive power supply circuit 120. Therefore, when the drive signal gives the command to turn ON the OFF-drive FET 122a, if the voltage of the current detection resistor 121b is the voltage of the drive power supply circuit 120, the judgment can be made than an open fault has occurred in the current detection resistor 121b.

According to the first embodiment, when the drive signal gives a command to supply the constant current from the ON-drive constant-current circuit 121 to the gate of the IGBT 110d, if the voltage of the current detection resistor 121b is a voltage that is the voltage of the drive power supply circuit 120 divided by the current detection resistor 121b and the resistors 1281c and 1281d, the control circuit 128 determines that an open fault has occurred in the current control FET 121a. When the drive signal gives the command to supply the constant current from the ON-drive constant-current circuit 121 to the gate of the IGBT 110d, the voltage of the current detection resistor 121b becomes a value based on the constant current being supplied. However, when an open fault occurs in the current control FET 121a, the current does not flow to the current detection resistor 121b. Because one end of the current detection resistor 121b is connected to the positive terminal of the drive power supply circuit 120 and the other end is connected to the negative terminal of the drive power supply circuit 120 with the resistors 1281c and 1281d therebetween, the voltage of the current detection resistor 121b becomes the voltage that is the voltage of the drive power supply circuit 120 divided by the current detection resistor 121b and the resistors 1281c and 1281d. Therefore, when the voltage of the current detection resistor 121b is the voltage that is the voltage of the drive power supply circuit 120 divided by the current detection resistor 121b and the resistors 1281c and 1281d, the judgment can be made that an open fault has occurred in the current control FET 121a.

According to the first embodiment, the wiring from the current detection resistor 121b to the current control circuit 1280 and the wiring from the current detection resistor 121b to the abnormality detection circuit 1281 are provided separately without sharing a section of the wiring. Therefore, even when the wiring from the current detection resistor 121b to the current control circuit 1280 becomes disconnected, the abnormality in the ON-drive constant-current circuit 121 can be detected.

According to the first embodiment, when an abnormality is detected in the ON-drive constant-current circuit 121, the control circuit 128 turns OFF the IGBT 110d by controlling a component other than the OFF-drive FET 122a, or specifically, by controlling the OFF-holding FET 123a. Therefore, thermal fracture of the IGBT 110d accompanying an abnormality in the ON-drive constant-current circuit 121 can be prevented.

According to the first embodiment, when an abnormality is detected in the ON-drive constant-current circuit 121, the control circuit 128 outputs an abnormality signal. Therefore, notification of the abnormality in the ON-drive constant current circuit 121 can be given outside.

Second Embodiment

A second embodiment of the subject application will hereinafter be described with reference to FIG. 5 to FIG. 7.

The motor control apparatus 1 according to the first embodiment includes a differential amplifier circuit in the abnormality detection circuit 1281. The connection point between the current control FET 121a and the current detection resistor 121b is connected to the negative terminal of the drive power supply circuit 120 with the resistors 1281c and 1281d configuring the differential amplifier circuit of the abnormality detection circuit therebetween. On the other hand, in a motor control apparatus according to the second embodiment, the differential amplifier circuit is eliminated, and the connection point between the current control FET and the current detection resistor is not connected to the negative terminal of the drive power supply circuit. The motor control apparatus according to the second embodiment has the same configuration as that of the motor control apparatus 1 according to the first embodiment, excluding the abnormality detection circuit.

First, a configuration of a control device will be described with reference to FIG. 5. Here, FIG. 5 is a circuit diagram of the control device according to the second embodiment. Here, differences from the control device 12 according to the first embodiment will be described. Descriptions of common sections are omitted unless required.

Figure 5:
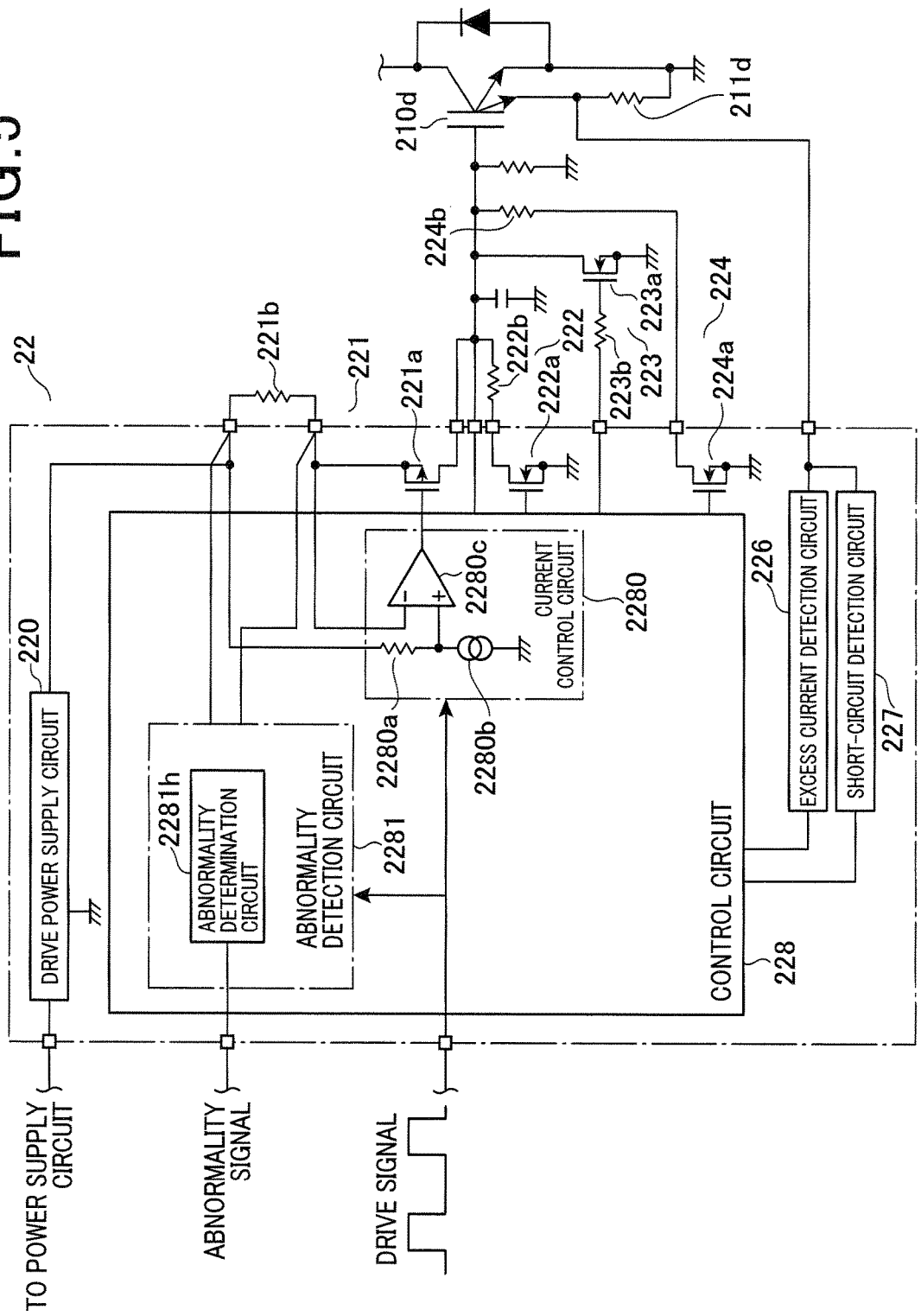
FIG. 5 is a circuit diagram of a control device according to a second embodiment.

As shown in FIG. 5, a control device 22 includes, for an IGBT 210d, a drive power supply circuit 220, an ON-drive constant-current circuit 221, an OFF-drive circuit 222, an OFF-holding circuit 223, a blocking circuit 224, an excess current detection circuit 226, a short-circuit detection circuit 227, and a control circuit 228. The IGBT 210d is equivalent to the IGBT 110d according to the first embodiment. A current-sensing resistor 211d is equivalent to the current-sensing resistor 111d according to the first embodiment. The drive power supply circuit 220, the ON-drive constant-current circuit 221, the OFF-drive circuit 222, the OFF-holding circuit 223, the blocking circuit 224, the excess current detection circuit 226, and the short-circuit detection circuit 227 have the same configurations as the drive power supply circuit 120, the ON-drive constant-current circuit 121, the OFF-drive circuit 122, the OFF-holding circuit 123, the blocking circuit 124, the excess current detection circuit 126, and the short-circuit detection circuit 127 according to the first embodiment.

The control circuit 228 includes a current control circuit 2280 and an abnormality detection circuit 2281. The current control circuit 2280 has the same configuration as the current control circuit 1280 according to the first embodiment.

The abnormality detection circuit 2281 is configured by an abnormality determination circuit 2281f. The abnormality determination circuit 2281f determines an abnormality in the ON-drive constant-current circuit 221 based on the voltage of the current detection resistor 221b and outputs an abnormality signal. One input terminal of the abnormality determination circuit 2281 is connected to one end of the current detection resistor 221b connected to the drive power supply circuit 220. The other input terminal is connected to the connection point between the current detection resistor 221b and the current control FET 221a.

Next, an abnormality detection operation of the ON-drive constant-current circuit 221 will be described with reference to FIG. 5 to FIG. 7. Here, FIG. 6 is a flowchart for describing the abnormality detection operation of the ON-drive constant-current circuit 221 according to the second embodiment. FIG. 7 is another flowchart for describing the abnormality detection operation of the ON-drive constant-current circuit 221 according to the second embodiment.

As shown in FIG. 6, when the drive signal gives a command to turn ON the IGBT 210d, or in other words, gives an instruction to supply the constant current from the ON-drive constant-current circuit 221 to the gate of the IGBT 210d (S200), if the voltage of the current detection resistor 221b is greater than the voltage when the constant current is being supplied (S203), the abnormality determination circuit 2281f shown in FIG. 5 determines that a short circuit has occurred in the current control FET 221a (S204). In addition, if the voltage of the current detection resistor 221b is 0V (S205), the abnormality determination circuit 2281f determines that an open fault has occurred in the current control FET 221a or a short circuit has occurred in the current detection resistor 221b (S206). The abnormality determination circuit 2281f returns to Step S200 in instances other than those above, and repeats similar processes.

On the other hand, as shown in FIG. 7, when the drive signal gives a command to turn OFF the IGBT 210d, or in other words, gives an instruction to stop the operation of the ON-drive constant-current circuit 221 and turn ON the OFF-drive FET 222a (S207), if the voltage of the current detection resistor 221b is greater than 0V (S208), the abnormality determination circuit 2281 determines that a short circuit has occurred in the current control FET 221a (S209). The abnormality determination circuit 2281f returns to Step S200 in instances other than those above, and repeats similar processes.

When determined that failure has occurred in at least either of the current control FET 221a and the current detection resistor 221b, as shown in FIG. 6, the control circuit 228 controls a component other than the OFF-drive FET 222a, or specifically, controls the OFF-holding FET 223a and turns OFF the IGBT 210d. The control circuit 228 also outputs an abnormality signal via the abnormality determination circuit 2281f (S210).

According to the second embodiment, unlike according to the first embodiment, the connection point between the current control FET 121a and the current detection resistor 121b is not connected to the negative terminal of the drive power supply circuit 120 with the resistors 1281c and 1281d therebetween. Therefore, judgment is not made as at Step S101 and S102. However, effects similar to those according to the first embodiment can be achieved regarding other points. In addition, because the differential amplifier circuit is not required to be provided, the configuration can be simplified compared to that of the first embodiment.

According to the first and second embodiments, in the flowcharts shown in FIG. 3, FIG. 4, FIG. 6, and FIG. 7, an example is given in which each judgment process based on the voltage of the current detection resistor is performed in a predetermined order. However, the present application is not limited thereto. The order in which each judgment process based on the voltage of the current detection resistor is performed may be changed. Furthermore, an alternative flowchart can be configured from a combination of some selected judgment processes.

According to the first and second embodiments, an example is given in which the drive power supply circuit 120 (220), the current control FET 121*a* (221*a*), the OFF-drive FET 122*a* (222*a*), the blocking FET 124*a* (224*a*), the excess current detection circuit 126 (226), the short-circuit detection circuit 127 (227), and the control circuit 128 (228) are integrally configured as an integrated circuit (IC). However, the present application is not limited thereto. When the current sent to the IGBT 110 (210) is large, the current control FET 121*a* (221*a*) may be configured to be externally attached to the IC.

What is claimed is:

1. An electronic control apparatus comprising:
   a switching element driven by a voltage of a control terminal being controlled;
   an ON-drive constant-current circuit connected to the control terminal of the switching element, supplying a constant current to the control terminal thereby charging the control terminal of the switching element with electrical charge, the ON-drive constant-current circuit including a current control transistor that controls the current supplied to the control terminal of the switching element, and a current detection resistor that detects a current flowing to the current control transistor and is used for detecting an abnormality in the ON-drive constant-current circuit, the current control transistor being disposed between the switching element and the current detection resistor in a current path where the constant current flows;
   a drive power supply circuit connected to the ON-drive constant-current circuit, supplying the voltage for driving the switching element;
   an OFF-drive switching element connected to the control terminal of the switching element, discharging electrical charge from the control terminal of the switching element by being turned ON; and
   a control circuit adapted to control the ON-drive constant-current circuit and the OFF-drive switching element in response to a drive signal being inputted, thereby controlling the voltage of the control terminal of the switching element so as to drive the switching element, the control circuit being connected to the current detection resistor and detecting a voltage across the current detection resistor, representing the current flowing to the current control transistor, wherein
      the control circuit, includes an operational amplifier circuit, and controls the current control transistor by using the voltage across the current detection resistor and by using the operational amplifier circuit to start driving the current control transistor in response to turning on of the drive signal, and supplies the constant current to the control terminal of the switching element, and detects the abnormality in the ON-drive constant-current circuit by using the drive signal in combination with the voltage across the current detection resistor, the abnormality detection being performed during a period in which the current supplied to the control terminal of the switching element is constant during the period, and the current supplied to the control terminal of the switching element is constant during the period regardless of a control terminal-emitter voltage of the switching element, and
      the drive power supply circuit, the current detection resistor, and the current control transistor are connected in series in this order in the current path with respect to the control terminal of the switching element, one end of the current detection resistor is connected to the drive power supply circuit, and the control circuit controls the voltage across the current detection resistor to be constant with respect to the voltage supplied by the drive power supply circuit.

2. The electronic control apparatus according to claim 1, wherein
   the control circuit determines that a short circuit has occurred in the current control transistor, when the drive signal gives a command to supply constant current to the control terminal of the switching element, if the voltage across the current detection resistor increases to be greater than the voltage across the current detection resistor expected when the constant current is being supplied in response to the command given by the drive signal.

3. The electronic control apparatus according to claim 1, wherein
   the control circuit determines that an open fault has occurred in the current control transistor or a short circuit has occurred in the current detection resistor when the voltage across the current detection resistor is 0V, while the drive signal gives a command to supply the constant current from the ON-drive constant-current circuit to the control terminal of the switching element.

4. The electronic control apparatus according to claim 1, wherein
   the control circuit determines that a short circuit has occurred in the current control transistor when the voltage across the current detection resistor is greater than 0V, while the drive signal gives a command to turn ON the OFF-drive switching element.

5. The electronic control apparatus according to claim 1, wherein
   an input terminal of the current control transistor is connected to a positive terminal of a drive power circuit included in the control circuit via the current detection resistor, an output terminal of the current control transistor is connected to the control terminal of the switching element, and a connection point between the current control transistor and the current detection resistor is connected to a negative terminal of the drive power supply circuit with a reference potential connection resistor therebetween.

6. The electronic control apparatus according to claim 5, wherein the control circuit determines that an open fault has occurred in the current detection resistor when the voltage across the current detection resistor is the voltage of the drive power supply circuit, while the drive signal gives a command to turn ON the OFF-drive switching element.

7. The electronic control apparatus according to claim 5, wherein the control circuit determines that an open fault has occurred in the current control transistor when the voltage across the current detection resistor is equal to a voltage where a voltage of the drive power supply circuit is divided by the current detection resistor and the reference potential connection resistor, while the drive signal gives a command to supply the constant current from the ON-drive constant-current circuit to the control terminal of the switching element.

8. The electronic control apparatus according to claim 1, wherein the control circuit includes:
   a current control circuit for controlling the current control transistor based on the voltage across the current detection resistor; and
   an abnormality detection circuit for detecting an abnormality in the ON-drive constant-current circuit based on the voltage across the current detection resistor, and wiring from the current detection resistor to the current control circuit and the wiring from the current detection resistor to the abnormality detection circuit are provided separately.

9. The electronic control apparatus according to claim 8, wherein the abnormality detection circuit is constituted by a differential amplifier that detects the voltage across the current detection resistor.

10. The electronic control apparatus according to claim 1, wherein
   the electronic control apparatus includes an OFF-holding switching element connected to the control terminal of the switching element and adapted to discharge electrical charge from the control terminal of the switching element by being turned ON, the control circuit turns OFF the switching element when an abnormality in the ON-drive constant-current circuit is detected.

11. The electronic control apparatus according to claim 10, wherein
   the control circuit is adapted to control the OFF-holding switching element such that when the voltage of the control terminal of the switching element becomes an OFF-holding threshold or less, the OFF-holding threshold being lower than an ON/OFF threshold voltage, the control circuit controls the OFF-holding switching element so as to hold the OFF-state of the switching element, and when an abnormality in the ON-drive constant-current circuit is detected, the control circuit controls the OFF-holding switching element so as to turn OFF the switching element.

12. The electronic control apparatus according to claim 1, wherein the control circuit outputs an abnormality signal when the control circuit detects an abnormality in the ON-drive constant-current circuit.

13. The electronic control apparatus according to claim 1, wherein the abnormality includes an open fault and a short circuit and the control circuit detects the open fault and the short circuit occurring on both of the current control transistor and the current detection resistor.

* * * * *